(12) United States Patent
Annunziata et al.

(10) Patent No.: US 10,734,571 B2
(45) Date of Patent: *Aug. 4, 2020

(54) MAGNETIC FIELD SENSOR BASED ON TOPOLOGICAL INSULATOR AND INSULATING COUPLER MATERIALS

(71) Applicant: International Business Machines Corporation, Armonk, NY (US)

(72) Inventors: Anthony J. Annunziata, Stamford, CT (US); Joel D. Chudow, Bronx, NY (US); Daniel C. Worledge, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/026,381

(22) Filed: Jul. 3, 2018

(65) Prior Publication Data

US 2018/0315918 A1   Nov. 1, 2018

Related U.S. Application Data

(63) Continuation of application No. 15/609,647, filed on May 31, 2017, now Pat. No. 10,170,688, which is a
(Continued)

(51) Int. Cl.
*H01L 43/02* (2006.01)
*H01L 43/12* (2006.01)
(Continued)

(52) U.S. Cl.
CPC ............ *H01L 43/02* (2013.01); *G01R 33/09* (2013.01); *G01R 33/1269* (2013.01);
(Continued)

(58) Field of Classification Search
CPC ...................................................... H01L 43/02
See application file for complete search history.

(56) References Cited

U.S. PATENT DOCUMENTS

| 8,860,078 | B2 | 10/2014 | Mcqueen et al. |
| 9,716,221 | B2 | 7/2017 | Annunziata et al. |
| (Continued) | | | |

FOREIGN PATENT DOCUMENTS

| CN | 103454602 A | 12/2013 |
| WO | 2014093681 A2 | 6/2014 |

OTHER PUBLICATIONS

List of IBM Patents or Patent Applications Treated as Related; Date Filed: Jul. 3, 2018, 2 pages.
(Continued)

*Primary Examiner* — Caridad Everhart
*Assistant Examiner* — Ankush K Singal
(74) *Attorney, Agent, or Firm* — Cantor Colburn LLP; Vazken Alexanian

(57) ABSTRACT

Embodiments are directed to a sensor having a first electrode, a second electrode and a detector region electrically coupled between the first electrode region and the second electrode region. The detector region includes a first layer having a topological insulator. The topological insulator includes a conducting path along a surface of the topological insulator, and the detector region further includes a second layer having a first insulating magnetic coupler, wherein a magnetic field applied to the detector region changes a resistance of the conducting path.

13 Claims, 6 Drawing Sheets

Related U.S. Application Data continuation of application No. 14/950,576, filed on Nov. 24, 2015, now Pat. No. 9,716,221, which is a continuation of application No. 14/823,541, filed on Aug. 11, 2015, now Pat. No. 9,941,463.

(51) Int. Cl.
*H01L 43/08* (2006.01)
*G01R 33/09* (2006.01)
*G01R 33/12* (2006.01)

(52) U.S. Cl.
CPC .......... *G01R 33/1276* (2013.01); *H01L 43/08* (2013.01); *H01L 43/12* (2013.01)

(56) References Cited

U.S. PATENT DOCUMENTS

| | | | |
|---|---|---|---|
| 9,941,463 | B2 | 4/2018 | Annunziata et al. |
| 2004/0165428 | A1* | 8/2004 | Odagawa ............... B82Y 10/00 365/171 |
| 2012/0138115 | A1 | 6/2012 | Chen |
| 2012/0138887 | A1* | 6/2012 | Zhang .................... H01F 1/401 257/9 |
| 2012/0273763 | A1 | 11/2012 | Banerjee et al. |
| 2013/0286511 | A1 | 10/2013 | Edelman et al. |
| 2014/0178674 | A1 | 6/2014 | Xue et al. |
| 2015/0325278 | A1 | 11/2015 | Bauer et al. |
| 2016/0035674 | A1 | 2/2016 | Zhang et al. |
| 2017/0047506 | A1 | 2/2017 | Annunziata et al. |
| 2017/0047511 | A1 | 2/2017 | Annunziata et al. |
| 2017/0279035 | A1 | 9/2017 | Annunziata et al. |

OTHER PUBLICATIONS

Fu et al., "Topological insulators with inversion symmetry," Physical Review B, vol. 76, No. 4, 2007, 045302, 17 pages.

Tang et al., "Two-dimensional transport-induced linear magneto-resistance in topological insulator Bi2Se3 nanoribbons," ACS Nano, vol. 5, No. 9, 2011, pp. 7510-7516.

Zhang et al., "Magneto-resistance up to 60 Tesla in topological insulator Bi2Te3 thin films," Applied Physics Letters, vol. 101, No. 20, 2012, 202403, 4 pages.

Zyuzin et al., "Thin topological insulator film in a perpendicular magnetic field," Physical Review B, vol. 83, No. 19, 2011, 195413, 4 pages.

\* cited by examiner

MAGNETIC FIELD SENSOR BASED ON TOPOLOGICAL INSULATOR AND INSULATING COUPLER MATERIALS

DOMESTIC PRIORITY

The application is a continuation of U.S. application Ser. No. 15/609,647, filed May 31, 2017, which is a continuation of U.S. application Ser. No. 14/950,576, filed Nov. 24, 2015, now issued as U.S. Pat. No. 9,716,221, which is a continuation of U.S. application Ser. No. 14/823,541, filed Aug. 11, 2015, now issued as U.S. Pat. No. 9,941,463, the contents of which are incorporated by reference herein in its entirety.

BACKGROUND

The present disclosure relates generally to the field of semiconductor materials and their fabrication. More specifically, the present disclosure relates to magnetic sensor semiconductor devices and methods of operation and fabrication thereof that use as the detection mechanism the response of a topological-insulator and an insulating coupler to a magnetic field having a particular magnitude and direction.

Magnetic sensors have a large range of potential applications, including, for example, biomedical detectors and non-volatile magnetic memory systems. Magnetic sensors operate based on an active sensing component sensing the presence or absence of magnetic fields having a particular magnitude and direction. The active sensing component senses based on quantum characteristics of the sensing component, such as the Hall Effect, giant or tunnel magnetoresistance, or superconducting quantum interference. Such sensing components often require special operating environments, including, for example, low temperature or a large bias. Additionally, magnetic sensors that utilize such sensing components can require complex fabrication processes that limit scalability.

It has been proposed to use topological insulator material as the active sensing component of magnetic sensors. Topological insulator materials, such as mercury telluride (HgTe), bismuth selenide ($Bi_2Se_3$), or bismuth telluride ($Bi_2Te_3$), exhibit quantum states of matter having time reversal symmetry, non-trivial topological order and a large band gap that makes them suitable for room temperature applications. A material that exhibits topological insulator characteristics behaves as an insulator in its interior but has conducting states at its surface, which means that electrons can only move along the surface of the material. More specifically, topological insulators possess an insulating bulk/interior, wherein an energy gap separates the highest occupied electronic valence energy band from the lowest empty conduction energy band. Topological-insulators also exhibit gapless surface states that are due to a strong spin-orbit coupling of electrons. Time reversal symmetry protects these conducting surface states from scattering by impurities. In the presence of a sufficiently strong applied perpendicular magnetic field, time-reversal symmetry is broken and an energy gap emerges for these surface states, which results in a change in the resistance of the topological insulator material in response to the magnetic field. Additionally, topological insulators demonstrate a non-saturating linear response to large magnetic fields due to weak anti-localization arising from strong spin-orbit coupling. Also, the temperature range in which a topological insulator material can effectively and reliably respond to an applied magnetic field can be relatively broad (i.e., ranging from absolute zero to 250 degrees Celsius).

Although topological insulators provide technical benefits when used as the active sensing component of a magnetic sensor, there remain areas such as sensitivity, overall performance and scalability in which the performance of topological insulators in magnetic sensing applications can be improved. For example, the magnetic field that is required to break time reversal symmetry of a topological insulator material can be relatively large, typically in the range of approximately 20 Tesla.

SUMMARY

Embodiments are directed to a sensor having a first electrode, a second electrode and a detector region electrically coupled between the first electrode region and the second electrode region. The detector region includes a first layer having a topological insulator. The topological insulator includes a conducing path along a surface of the topological insulator, and the detector region further includes a second layer having a first insulating magnetic coupler, wherein a magnetic field applied to the detector region changes a resistance of the conducting path.

Embodiments are further directed to a method of forming a sensor. The method includes forming a first electrode, forming a second electrode and forming a detector region. The method further includes electrically coupling the detector region to the first electrode and the second electrode, and forming the detector region to include a first layer comprising a topological insulator. The topological insulator includes a conducing path along a surface of the topological insulator. The method further includes forming the detector region to further include a second layer comprising a first insulating magnetic coupler, wherein a magnetic field applied to the detector region changes a resistance of the conducting path, and wherein the first insulating magnetic coupler amplifies the magnetic field applied to the detector region.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present disclosure is particularly pointed out and distinctly claimed in the claims at the conclusion of the specification. The foregoing and other features and advantages are apparent from the following detailed description taken in conjunction with the accompanying drawings in which:

Figure 1:
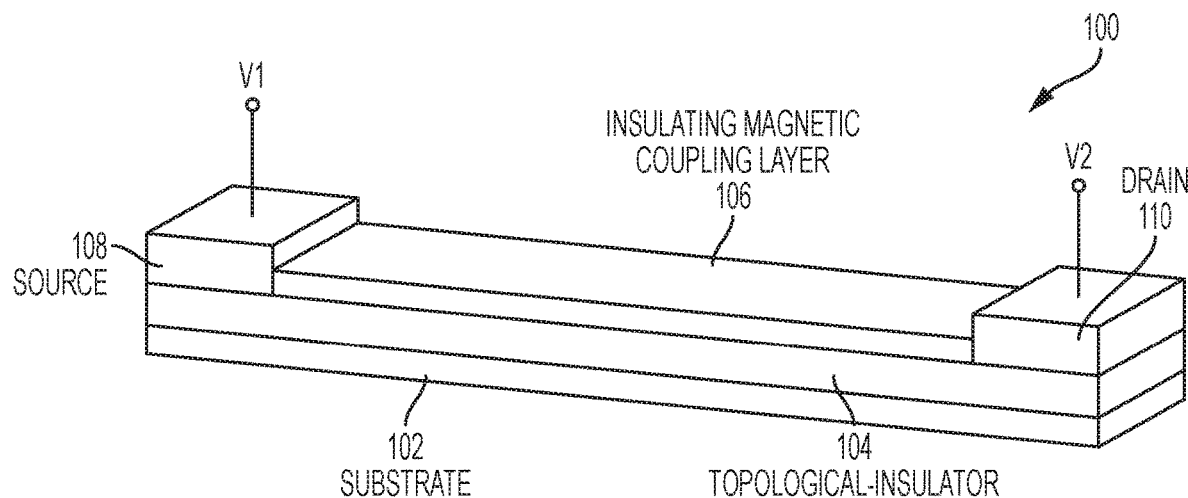
FIG. 1 depicts a three dimensional view of a semiconductor device according to one or more embodiments.

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

Various embodiments of the present disclosure will now be described with reference to the related drawings. Alternate embodiments may be devised without departing from the scope of this disclosure. It is noted that various connections are set forth between elements in the following description and in the drawings. These connections, unless specified otherwise, may be direct or indirect, and the present disclosure is not intended to be limiting in this respect. Accordingly, a coupling of entities may refer to either a direct or an indirect connection.

Similarly, although the operations of methodologies disclosed herein are illustrated in a particular order, it will be understood by persons of ordinary skill in the relevant art that the order of the illustrated operations may be changed without departing from the teachings of the present disclosure. In addition, it will be understood by persons of ordinary skill in the relevant art that one or more of the illustrated operations may be omitted, and/or operations not shown (e.g., routine intermediary operations) may be incorporated, without departing from the teachings of the present disclosure.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based devices are well known and so, in the interest of brevity, many conventional steps may only be mentioned briefly herein or may be omitted entirely without providing the well-known process details.

As previously noted herein, magnetic sensors have a large range of potential applications, including, for example, biomedical detectors and non-volatile magnetic memory systems. Magnetic sensors operate based on an active sensing component sensing the presence or absence of magnetic fields having a particular magnitude and direction. The active sensing component may be based on quantum characteristics of the sensing component, such as the Hall Effect, giant or tunnel magnetoresistance, or superconducting quantum interference. Such sensing components often require special operating environments, including, for example, low temperature or a large bias. Additionally, magnetic sensors that utilize these sensing components can require complex fabrication processes that limit scalability.

It is known to use a topological insulator as the active sensing component of a magnetic sensor. A topological insulator is a material with non-trivial topological order that behaves as an insulator in its interior. However, the surface of a topological insulator contains conducting states, which means that electrons can only move along the surface of the material. Although ordinary band insulators can also support conductive surface states, the surface states of topological insulators are unique because they are symmetry protected by particle number conservation and time reversal symmetry. More specifically, in the bulk/interior of a non-interacting topological insulator, the electronic band structure resembles an ordinary band insulator (i.e., the Fermi level falls between the conduction and valence bands). However, on the surface of a topological insulator there are special states that fall within the bulk energy gap and allow surface metallic conduction. Carriers in these surface states have their spin locked at a right-angle to their momentum, which is known generally as spin-momentum locking. At a given energy the only other available electronic states have different spin, which suppresses scattering and causes conduction on the surface of the material to be highly metallic. The surface conduction states are required by time-reversal symmetry and the band structure of the material. These surface conducting states can be removed by breaking the topological insulator's time-reversal symmetry, which does not happen with potential and/or spin-orbit scattering, but instead happens in the presence of a sufficiently strong (e.g., approximately 20 Tesla) magnetic field.

An exemplary two terminal magnetic sensor device that incorporates a thin-film topological insulator as the active sensing element is described in a co-pending, commonly assigned U.S. patent application, titled "Thin Film Device With Protective Layer," having application Ser. No. 14/571,771, filed on Dec. 16, 2014, the entire disclosure of which is incorporated by reference herein.

Turning now to a more general overview of the present disclosure, one or more disclosed embodiments provide magnetic sensor semiconductor devices and methods of operation and fabrication thereof that use as the detection mechanism the response of a topological-insulator having an insulating coupler to a magnetic field having a particular magnitude and direction. In one or more embodiments, the sensor includes a thin-film topological insulator grown using a technique such as molecular beam epitaxy. The topological insulator is contacted on both ends by metal electrodes to form a two-terminal electrical device. The thin-film topological insulator may include a large surface-to-volume ratio, and may also include magnetic doping. The insulating magnetic coupler is provided above, below or around (i.e., both above and below) the thin-film topological insulator.

When a bias voltage is applied between the electrodes, and when no magnetic field is applied, a current flows through the topological insulator surface states between the electrodes. When a magnetic field is introduced, for example, a magnetic field exceeding a certain magnitude and pointed perpendicular to the topological insulator surface, the topological insulator surface states develop an energy gap and are no longer conducting, which reduces the current flow, increases resistance and produces a measurable change. This measureable change in the magnetic sensing component (i.e., topological insulator) can be used in a variety of sensing and/or switching applications such as biomedical detectors and non-volatile magnetic memory systems.

The magnitude of the magnetic field that is required to break time reversal symmetry of known thin-film topological insulator materials must be relatively large, typically in the range of approximately 20 Tesla. According to one or more embodiments, the insulating magnetic coupler is sufficiently close to the thin-film topological insulator to amplify the applied magnetic field based at least in part on a magnetic exchange effect between the insulating magnetic coupler and the thin-film topological insulator. Accordingly, a magnetic sensor according to the present disclosure can respond to relatively small applied perpendicular magnetic field magnitudes (e.g., 0.10 Tesla) because the insulating magnetic coupler amplifies the applied perpendicular magnetic field magnitude to a level that is sufficient to break time reversal symmetry of the thin film topological insulator sensing mechanism, thereby causing a measureable change in the thin film topological insulator's conductance/resistance. The insulating magnetic coupler may contact the thin film topological insulator, or it may be positioned sufficiently close to the thin film topological insulator to effect a magnetic exchange between the insulating magnetic coupler and the thin film topological insulator. As noted above, the insulating magnetic coupler may be above, below or both above and below the thin-film topological insulator.

Materials that can serve as the insulating magnetic coupler include, for example, europium sulfide, europium oxide, hollandite chromium oxide (low-temperature operations), yttrium iron garnet, or a cobalt-iron-aluminum-oxide multilayer (for room-temperature and above operation). For the cobalt-iron-aluminum-oxide multilayer implementation, the crystal structure templating, oxidation method/duration, and annealing conditions determine its magnetic properties. The insulating properties generally come from the oxygen present in the structure. These materials can also be doped with other elements (such as lanthanum, neodymium, cadmium, or vanadium) to enhance their magnetic properties and they can generally be synthesized using several techniques, including sputtering, molecular beam epitaxy, and pulsed laser deposition.

As described above, in one or more embodiments, the topological insulator may be doped/implanted with magnetic atoms/particles. In such embodiments, in addition to the amplification provided by the insulating magnetic coupler, the applied perpendicular magnetic field magnitude is even further amplified by the magnetic particles. The implanted magnetic particles may be applied to the bulk/interior, the surface state or both the bulk and the surface state areas of the thin-film topological insulator. The implanted magnetic particles further enhance the coupling of an applied magnetic field to the thin-film topological insulator surface. The magnetic particles can have randomly oriented individual magnetic moments, but when in the presence of an outside magnetic field, the magnetic moments of these particles can align with a sizable magnetic moment and induce a much stronger magnetic coupling to the thin-film topological insulator.

In one or more embodiments, an array of the disclosed magnetic sensor semiconductor devices may be formed at a nanoscale level on a substrate and ribbed metallic electrode structures and capped with another insulating magnetic coupler layer or a conformal cap (e.g., silicon-nitride) to vacuum protect the magnetic sensor surfaces in a manner that is compatible with standard CMOS integration. Each magnetic sensor (i.e., pixel) of the array can be individually addressed for detection readout. Additionally, conformal growth of topological insulator materials on both the ribbed metal structure and the substrate can provide an extra vertical topological insulator section of the device, which may be utilized to detect magnetic fields in additional dimensions. For example, such a magnetic sensor configuration can simultaneously detect fields pointing out-of-plane (i.e., perpendicular to the substrate) and in-plane (i.e., parallel to the substrate, or perpendicular to the ribbed side of the substrate).

Accordingly, a magnetic sensor according to the present disclosure operates with increased sensitivity over a broader range of applied magnetic field strengths (e.g., from about 0.10 Tesla to about 20 Tesla), which also allows for operation over a broader range of temperatures (e.g., from absolute zero to 250 degrees Celsius). There are no intrinsic size requirements for the disclosed magnetic sensor. The disclosed magnetic sensor is intrinsically scalable because it becomes more sensitive as it becomes smaller, and because it does not have a net magnetic moment and therefore there are no offset fields to cancel. The disclosed magnetic sensor device possesses low-power requirements because only a small bias current is needed to readout the device.

Figure 2:
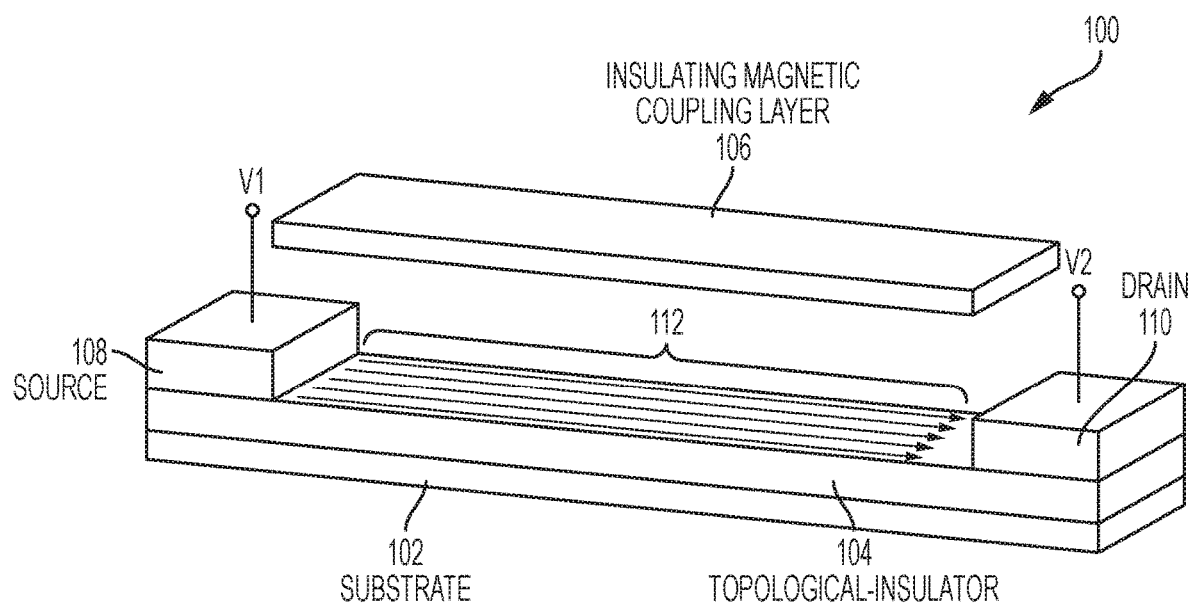
FIG. 2 depicts a three dimensional view of a semiconductor device according to one or more embodiments.

Turning now to a more detailed description of the present disclosure, FIGS. 1-4 depict three dimensional views of a magnetic sensor semiconductor device 100 according to one or more embodiments. Magnetic sensor 100 includes a substrate 102, a thin-film topological insulator layer 104, a first insulating magnetic coupler layer 106, a first electrode 108 and a second electrode 110, configured and arranged as shown. FIG. 1 depicts magnetic sensor 100 in its steady state, wherein a bias voltage is present across first and second electrodes 108, 110, no magnetic field is present and a current 112 (shown in FIG. 2) flows along a surface of thin-film topological insulator 104 from first electrode 108 to second electrode 110. FIG. 2 depicts the steady state of magnetic sensor 100 shown in FIG. 1, wherein first insulating magnetic coupler layer 106 is shown, for illustration purposes, separated away from topological insulator layer 104 in order to illustrate current 112 flowing along a surface of topological insulator layer 104.

Figure 3:
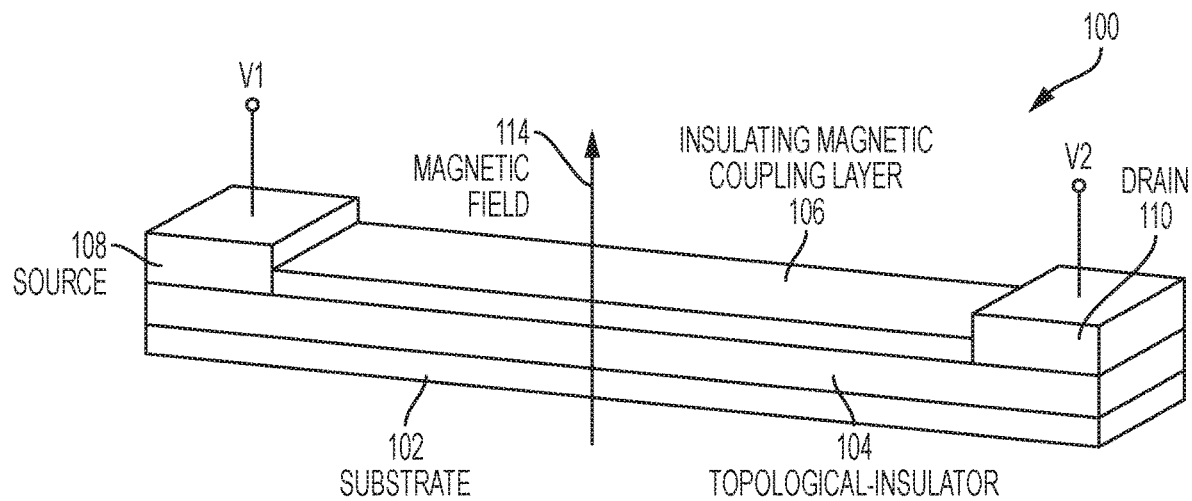
FIG. 3 depicts a three dimensional view of a semiconductor device according to one or more embodiments.
Figure 4:
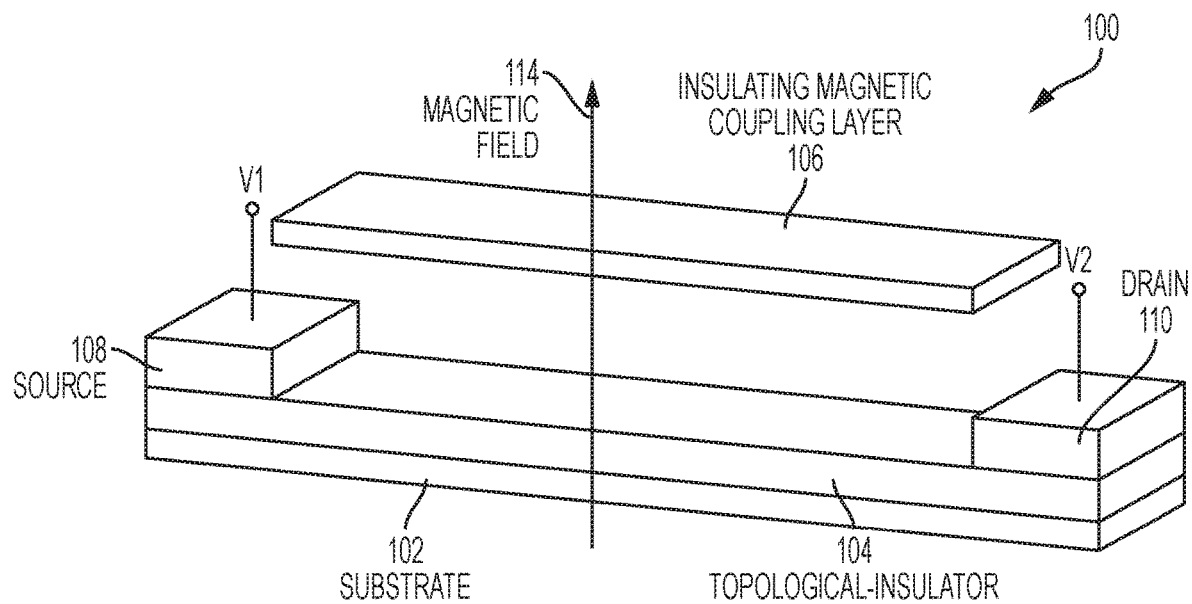
FIG. 4 depicts a three dimensional view of a semiconductor device according to one or more embodiments.

FIGS. 3 and 4 depict magnetic sensor 100 when an out-of-plane magnetic field 114 of sufficient magnitude (e.g., greater than about 0.10 Tesla) is present. Similar to FIGS. 1 and 2, FIG. 3 depicts thin-film topological insulator layer 104 adjacent first insulating magnetic coupler layer 106, and FIG. 4 depicts first insulating magnetic coupler layer 106, for illustration purposes, separated away from topological insulator layer 104 in order to illustrate that current has been significantly reduced or is no longer flowing along a surface of topological insulator layer 104. As shown in FIGS. 3 and 4, in the presence of magnetic field 114, the surface states of thin-film topological insulator layer 104 develop an energy gap, which ceases or substantially reduces current flow (112 shown in FIG. 2), increases resistance and produces a measurable change. The measureable change in the resistance of the surface states of thin-film topological insulator layer 104 allows magnetic sensor 100 to be used in a variety of sensing and/or switching applications such as biomedical detectors and in non-volatile magnetic memory systems.

First insulating magnetic coupler layer 106 is sufficiently close to thin-film topological insulator layer 104 to amplify applied magnetic field 114 based at least in part on a magnetic exchange effect between first insulating magnetic coupler layer 106 and thin-film topological insulator layer 106. Accordingly, magnetic sensor 100 according to the present disclosure can respond to an applied magnetic field (e.g., magnetic field 114) having a relatively small magnitude (e.g., about 0.10 Tesla) because first insulating magnetic coupler layer 106 amplifies the magnitude of applied perpendicular magnetic field 114 to a level that is sufficient to break time reversal symmetry of thin-film topological insulator layer 104, thereby causing a measureable change in a conductance/resistance of thin-film topological insulator layer 104.

First insulating magnetic coupler layer 106 is shown in FIG. 1 in contact with thin-film topological insulator layer 106. Alternatively, thin-film topological insulator layer 106 may be positioned sufficiently close to thin-film topological insulator layer 104 to effect a magnetic exchange between first insulating magnetic coupler layer 106 and thin-film topological insulator layer 104. Additionally, first insulating magnetic coupler layer 106 is shown above thin-film topological insulator layer 104. Alternatively, insulating magnetic coupler layer 106 may be positioned above, below or both above and below thin-film topological insulator layer 104.

In one or more embodiments, in addition to the amplification provided by first insulating magnetic coupler layer 106, the magnitude of applied perpendicular magnetic field 114 may be even further amplified by doping/implanting thin film topological insulator layer 104 with magnetic atoms/particles (not shown). The implanted magnetic particles may be applied to the interior area, the surface state area or both the interior and the surface state areas of thin-film topological insulator layer 104. As previously described herein, the implanted magnetic particles further enhance the coupling of applied magnetic field 114 to thin-film topological insulator layer 104 because the implanted magnetic particles can have randomly oriented individual magnetic moments, but when in the presence of an outside magnetic field (e.g., magnetic field 114), the magnetic moments of these particles can align with a sizable magnetic moment and induce a much stronger magnetic coupling to thin-film topological insulator layer 104.

Figure 5:
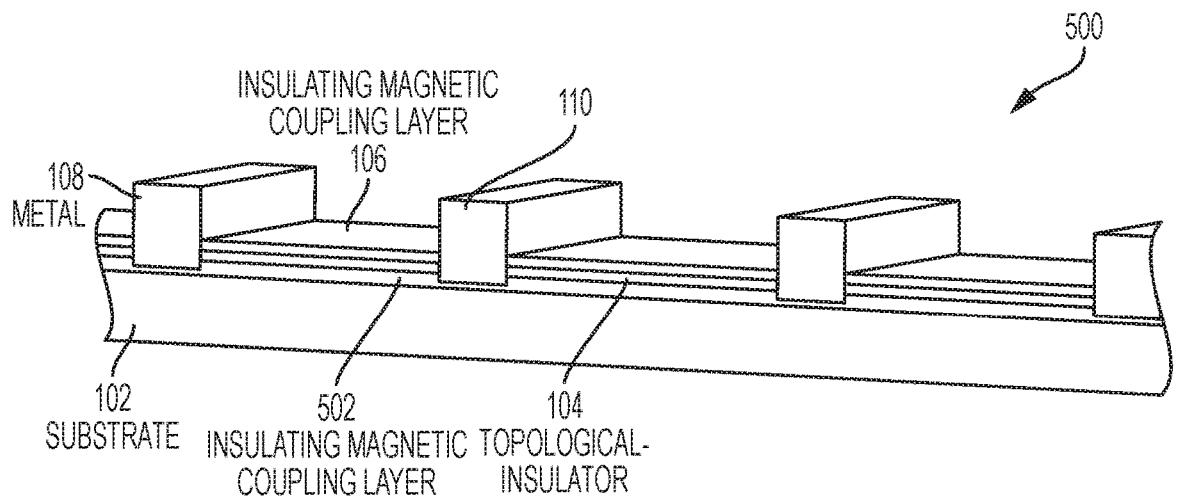
FIG. 5 depicts a three dimensional view of an array of semiconductor devices according to one or more embodiments.

FIG. 5 depicts a three-dimensional view of magnetic sensor semiconductor devices configured as an array 500 according to one or more embodiments. The structure and operation of the magnetic sensor devices shown in FIG. 5 substantially correspond to the structure and operation of magnetic sensor 100 shown in FIGS. 1-4 with the addition of a second insulating magnetic coupler layer 502 located below thin-film topological insulator layer 104. Additionally, first and second electrodes 108, 110 are implemented as ribbed metallic structures. Second insulating magnetic coupler layer 502 provides magnetic field amplification in addition to, and in a manner substantially the same as, the magnetic field amplification provided by first insulating magnetic coupler layer 106. For ease of illustration, only one of the three magnetic sensor devices shown in FIG. 5 is provided with reference numbers. Additionally, although an insulating magnetic coupler layer (106, 502) is shown above and below topological insulator layer 104, an insulating magnetic coupler layer may also be provided only above or only below topological insulator layer 104 of the magnetic sensor shown in FIG. 5. Each magnetic sensor of array 500 can be individually addressed for detection readout.

In one or more embodiments, in addition to the amplification provided by first insulating magnetic coupler layer 106 and second insulating magnetic coupler layer 502, the magnitude of applied perpendicular magnetic field 114 (shown in FIGS. 2 and 4) may be even further amplified by doping/implanting thin film topological insulator layer 104 with magnetic atoms/particles (not shown). The implanted magnetic particles may be applied to the interior area, the surface state area or both the interior and the surface state areas of thin-film topological insulator layer 104. As previously described herein, the implanted magnetic particles further enhance the coupling of applied magnetic field 114 to thin-film topological insulator layer 104 because the implanted magnetic particles can have randomly oriented individual magnetic moments, but when in the presence of an outside magnetic field (e.g., magnetic field 114), the magnetic moments of these particles can align with a sizable magnetic moment and induce a much stronger magnetic coupling to thin-film topological insulator layer 104.

Figure 6:
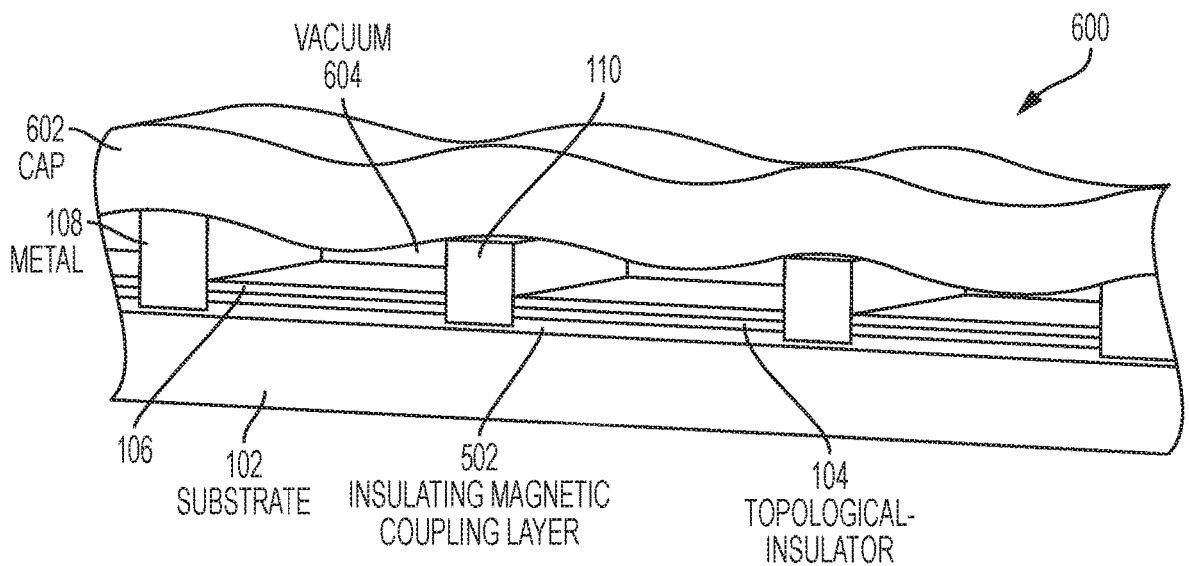
FIG. 6 depicts a three dimensional view of an array of semiconductor device according to one or more embodiments.

FIG. 6 depicts a three-dimensional view of magnetic sensor semiconductor devices configured as an array 600 according to one or more embodiments. The structure and operation of the magnetic sensor devices shown in FIG. 6 substantially correspond to the structure and operation of the magnetic sensors shown in FIG. 5 with the addition of a third insulating magnetic coupler layer 602 or a conformal cap (e.g., silicon-nitride) to form vacuum areas 604 that protect the surfaces of the magnetic sensors in a manner that is compatible with standard CMOS integration. For ease of illustration, only one of the three magnetic sensor devices of array 600 is provided with reference numbers. Additionally, although an insulating magnetic coupler layer (106, 502) is shown above and below topological insulator layer 104, an insulating magnetic coupler layer may also be provided only above or only below topological insulator layer 104 of the magnetic sensor shown in FIG. 6. Each magnetic sensor of array 600 can be individually addressed for detection readout.

Similar to array 500, for the magnetic sensors of array 600, in addition to the amplification provided by first insulating magnetic coupler layer 106 and second insulating magnetic coupler layer 502, the magnitude of applied perpendicular magnetic field 114 (shown in FIGS. 2 and 4) may be even further amplified by doping/implanting thin film topological insulator layer 104 with magnetic atoms/particles (not shown). The implanted magnetic particles may be applied to the interior area, the surface state area or both the interior and the surface state areas of thin-film topological insulator layer 104. As previously described herein, the implanted magnetic particles further enhance the coupling of applied magnetic field 114 to thin-film topological insulator layer 104 because the implanted magnetic particles can have randomly oriented individual magnetic moments, but when in the presence of an outside magnetic field (e.g., magnetic field 114), the magnetic moments of these particles can align with a sizable magnetic moment and induce a much stronger magnetic coupling to thin-film topological insulator layer 104.

Figure 12:
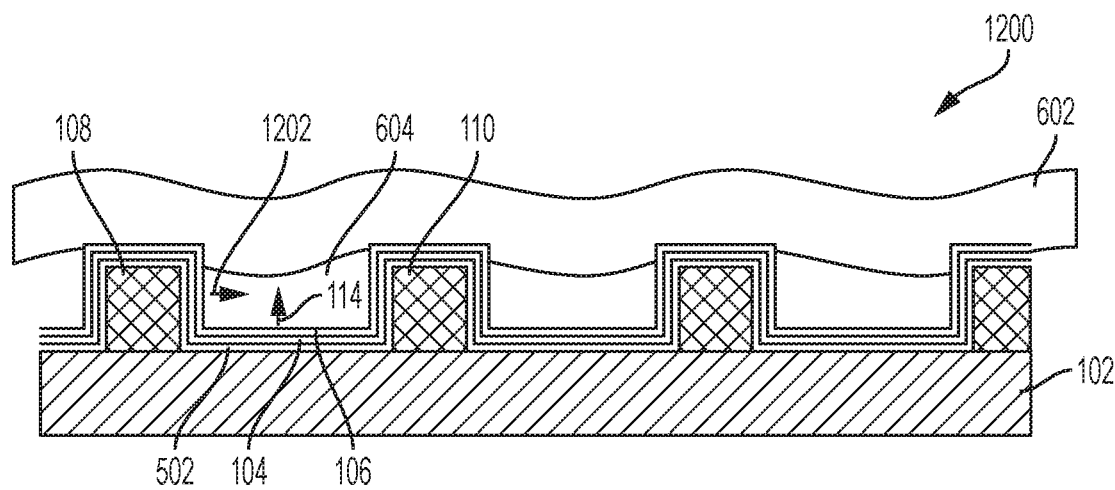
FIG. 12 depicts a cross sectional view of an array of semiconductor devices according to one or more embodiments.

FIG. 12 depicts a two-dimensional view of magnetic sensor semiconductor devices configured as an array 1200 according to one or more embodiments. The structure and operation of the magnetic sensor devices shown in FIG. 12 substantially correspond to the structure and operation of the magnetic sensors shown in FIGS. 5 and 6 with the addition of thin-film topological insulator layer 104 and first and second insulating magnetic coupler layers 106, 502 grown conformally over ribbed metallic electrodes 108, 110 and substrate 102. Conformal growth of topological insulator layer 104 over both ribbed metallic electrode structures 108, 110 and substrate 102 can provide an extra vertical topological insulator section of the magnetic sensor device, which may be utilized to detect magnetic fields in additional dimensions. For example, such a magnetic sensor configuration can simultaneously detecting fields pointing out-of-plane (i.e., perpendicular to the substrate) (e.g., magnetic field 114) and in-plane (i.e., parallel to the substrate, or perpendicular to the ribbed side of the substrate) (e.g., magnetic field 1202). For ease of illustration, only one of the three magnetic sensor devices of array 1200 is provided with reference numbers. Additionally, although an insulating magnetic coupler layer (106, 502) is shown above and below topological insulator layer 104, an insulating magnetic coupler layer may also be provided only above or only below topological insulator layer 104 of the magnetic sensor shown in FIG. 12. Each magnetic sensor of array 1200 can be individually addressed for detection readout.

Similar to arrays 500, 600, for the magnetic sensors of array 1200, in addition to the amplification provided by first insulating magnetic coupler layer 106 and second insulating magnetic coupler layer 502, the magnitudes of applied perpendicular magnetic field 114 (shown in FIGS. 2 and 4) and applied parallel magnetic field 1202 may be even further amplified by doping/implanting thin film topological insulator layer 104 with magnetic atoms/particles (not shown). The implanted magnetic particles may be applied to the interior area, the surface state area or both the interior and the surface state areas of thin-film topological insulator layer 104. As previously described herein, the implanted magnetic particles further enhance the coupling of applied magnetic field 114 and applied magnetic field 1202 to thin-film topological insulator layer 104 because the implanted magnetic particles can have randomly oriented individual magnetic moments, but when in the presence of an outside magnetic field (e.g., magnetic field 114 and/or magnetic field 1202), the magnetic moments of these particles can align with a sizable magnetic moment and induce a much stronger magnetic coupling to thin-film topological insulator layer 104.

Figure 7:
FIG. 7 depicts a cross sectional view of a semiconductor substrate after an initial fabrication stage according to one or more embodiments.

FIGS. 7-12 depict various fabrication stages in forming array 1200 shown in FIG. 12. FIG. 7 depicts semiconductor substrate 102 upon which embodiments of the present disclosure can be fabricated. Semiconductor substrate 102 is preferably composed of a silicon (Si) containing material. Silicon containing materials include, but are not limited to, Si, single crystal Si, polycrystalline Si, silicon-germanium (SiGe), single crystal SiGe, polycrystalline SiGe, or Si doped with carbon (C), amorphous Si and combinations and multi-layers thereof. Semiconductor substrate 102 can also be composed of other semiconductor materials, such as Ge, and compound semiconductor substrates such as type III/V semiconductor substrates, e.g., gallium arsenide (GaAs) or indium phosphide (InP). In general, semiconductor substrate 102 is a smooth surface substrate. In some embodiments (not shown), semiconductor substrate 102 can be a partially processed complementary metal-oxide-semiconductor (CMOS) integrated wafer with transistors and wiring levels or gate electrodes embedded beneath the surface.

Figure 8:
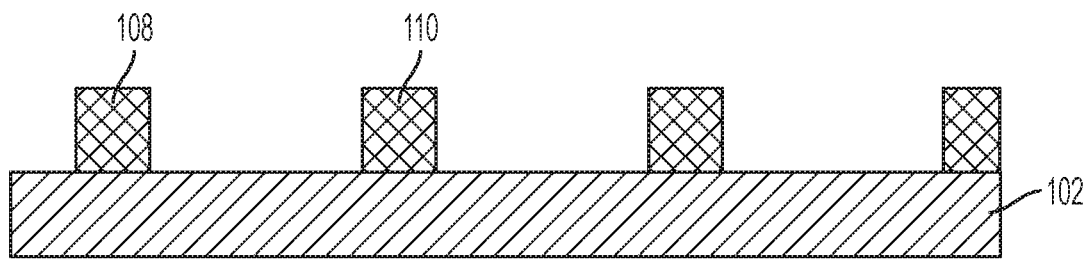
FIG. 8 depicts a cross sectional view of an array of semiconductor devices after an intermediate fabrication stage according to one or more embodiments.

In FIG. 8, ribbed metal electrodes (e.g., 108, 110) are formed on top of semiconductor substrate 102 using techniques known in the art. In one embodiment, ribbed metal electrodes are formed using a photolithographic and subtractive etching process to define the structure of the ribbed metal. Photolithography is a process to pattern parts of a thin film or the bulk of a substrate. For example, a metal layer can be initially formed on top of semiconductor substrate 102, and ribbed metal electrodes (e.g., 108, 110) may be formed by selective etching of the metal layer. The ribbed metal electrodes can be composed of different types of metal, such as, but not limited to, copper, aluminum, gold, palladium or any other conductive material. In some embodiments, the ribbed metal electrodes have a nonmetallic, and/or nonconductive top layer (not shown). In general, individual ribs (not shown) of the ribbed metal electrodes act as terminals for the resulting magnetic sensor devices of array 1200. In some embodiments, individual ribs of the ribbed metal electrodes act as a shunt between sections of the resulting magnetic sensor devices of array 1200 that are in contact with semiconductor substrate 102.

In some embodiments, each rib of the ribbed metal electrodes is of the same type of metal. In other embodiments, individual portions of the ribbed metal electrodes can be different types of metal. In some embodiments, individual portions of the ribbed metal electrodes are disposed on top of semiconductor substrate 102 in a periodic order. In other embodiments, individual portions of the ribbed metal electrodes are disposed on top of semiconductor substrate 102 in an aperiodic order.

In some embodiments, individual portions of the ribbed metal electrodes make electrical contact with a circuit, such as a readout circuit, located at the end of or beneath respective ribs. For example, each portion of the ribbed metal electrodes can be an elongated, rod-like member or structure that extends to, or near, the edge of semiconductor substrate 102 and can make electrical contact with a circuit located at the described location. In other embodiments, individual portions of the ribbed metal electrodes form islands on top of semiconductor substrate 102. In such an embodiment, individual portions of the ribbed metal electrodes can be connected to transistors through semiconductor substrate 102, such as, for example, when semiconductor substrate 102 is a partially processed CMOS-integrated wafer with transistors and wiring levels or gate electrode (not shown) beneath the surface of semiconductor substrate 102.

Figure 9:
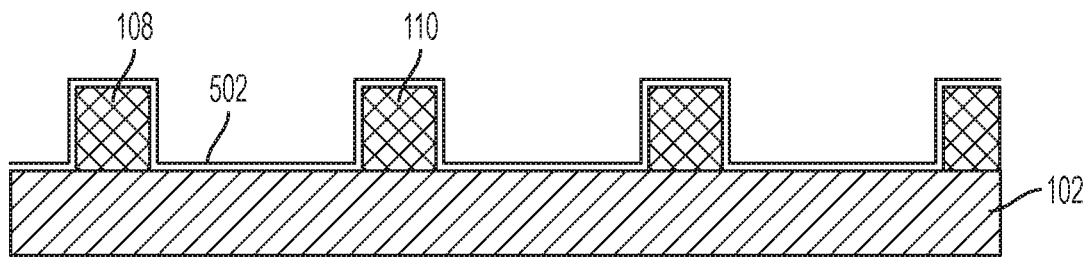
FIG. 9 depicts a cross sectional view of an array of semiconductor devices after an intermediate fabrication stage according to one or more embodiments.

In FIG. 9, second insulating magnetic coupler layer 502 is formed on top of ribbed metal electrodes (e.g., 108, 110) and substrate 102 in a conformal fashion. Second insulating magnetic coupler layer 502 may be any material or combination of materials that exhibit both insulating properties and magnetic coupling properties. Second insulating magnetic coupler layer 502 may be formed using deposition methods known in the art. The specific type of deposition method used to deposit second magnetic coupler layer 502 can vary based upon the specific material(s) that comprise second insulating magnetic coupler layer 502. For example, second insulating magnetic coupler layer 502 can be deposited via direct transfer, spin coating, evaporation, sputtering, or other techniques known in the art, in accordance with the selected material of second insulating magnetic coupler layer 502, in accordance with the embodiment of the present disclosure. Second insulating magnetic coupler layer 502 may be implemented as a multi-layer element, as desired for particular applications.

Figure 10:
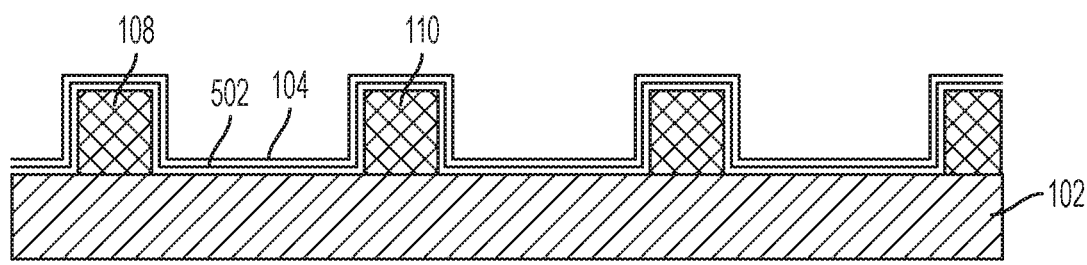
FIG. 10 depicts a cross sectional view of an array of semiconductor devices after an intermediate fabrication stage according to one or more embodiments.

In FIG. 10, thin-film topological insulator layer 104 is formed on top of second insulating magnetic coupling layer 502 in a conformal fashion. Thin-film topological insulator layer 104 can be, for example, a topological insulator, graphene, carbon nanotubes, transition metal dichalcogenide monolayers, hexagonal boron nitride, or boron nanotubes. Similar to second insulating magnetic coupler layer 502, thin-film topological insulator layer 104 may be formed using deposition methods known in the art. The specific type of deposition method used to deposit thin-film topological insulator layer 104 can vary based upon the specific material(s) that comprise thin-film topological insulator layer 104.

For example, thin-film topological insulator layer 104 can be deposited via direct transfer, spin coating, evaporation, sputtering, or other techniques known in the art, in accordance with the selected material of thin-film topological insulator layer 104, in accordance with the embodiment of the present disclosure. Thin-film topological insulator layer 104 may be implemented as a multi-layer element, as desired for particular applications. In some embodiments, a chemical or other type of surface preparation is used on thin-film topological insulator layer 104, or a seed layer is deposited. Such preparation can facilitate increased ohmic electrical contact between thin film topological insulator 104 and the ribbed metal electrodes (e.g., 108, 110).

Figure 11:
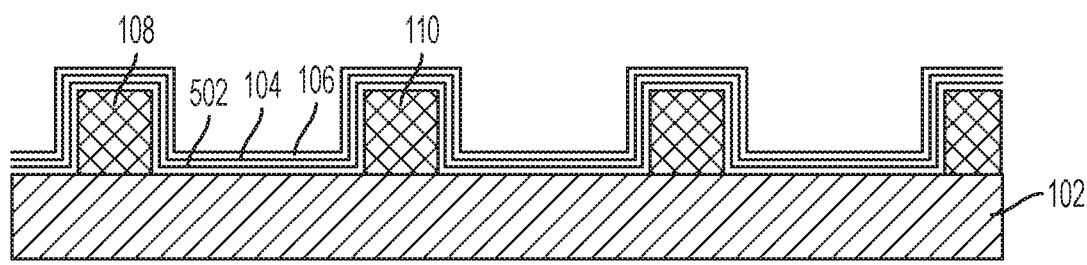
FIG. 11 depicts a cross sectional view of an array of semiconductor devices after an intermediate fabrication stage according to one or more embodiments.

In FIG. 11, first insulating magnetic coupler layer 502 is formed on top of thin-film topological insulator layer 104 in a conformal fashion. First insulating magnetic coupler layer 104 may be any material or combination of materials that exhibit both insulating properties and magnetic coupling properties. First insulating magnetic coupler layer 104 may be formed using deposition methods known in the art. The specific type of deposition method used to deposit first magnetic coupler layer 104 can vary based upon the specific material(s) that comprise first insulating magnetic coupler layer 104. For example, first insulating magnetic coupler layer 104 can be deposited via direct transfer, spin coating, evaporation, sputtering, or other techniques known in the art, in accordance with the selected material of first insulating magnetic coupler layer 104, in accordance with the embodiment of the present disclosure. First insulating magnetic coupler layer 104 may be implemented as a multi-layer element, as desired for particular applications.

Materials that can serve as first or second insulating magnetic coupler layers 106, 502 include, for example, europium sulfide, europium oxide, hollandite chromium oxide (low-temperature operations), yttrium iron garnet, or a cobalt-iron-aluminum-oxide multilayer (for room-temperature and above operation). For the cobalt-iron-aluminum-oxide multilayer implementation, the crystal structure templating, oxidation method/duration, and annealing conditions determine its magnetic properties. The insulating properties generally come from the oxygen present in the structure. These materials can also be doped with other elements (such as lanthanum, neodymium, cadmium, or vanadium) to enhance their magnetic properties and they can generally be synthesized using several techniques, including sputtering, molecular beam epitaxy, and pulsed laser deposition.

In FIG. 12, a third insulating magnetic coupler layer 602 or a conformal cap (e.g., silicon-nitride) is formed over the ribbed metallic electrodes (e.g., 108, 110) to form vacuum areas 604 that protect the surfaces of the magnetic sensors in a manner that is compatible with standard CMOS integration. Capping layer 602 can be a dielectric material. For example, capping layer 602 can be oxide, nitride, silicon nitride, or any other dielectric material. In general, capping layer 602 is deposited such that at least one enclosed space, such as enclosed space 604, is created. In some embodiments, capping layer 602 is deposited in a non-conformal manner. In other embodiments, capping layer 602 is deposited in a semi-conformal manner. In some embodiments, capping layer 602 is deposited such that capping layer 602 contacts the top surface of portions of the ribbed metal electrodes (e.g., 108, 110). In general, capping layer 602 is deposited such that capping layer 602 does not contact one or more portions of first and second insulating magnetic coupler layers 106, 502 and thin film topological insulator layer 104 that are in contact with semiconductor substrate 102 and are between two portions of the ribbed metal electrodes.

In some embodiments, capping layer 602 is deposited while the device is in a vacuum, or substantial vacuum. For example, capping layer 602 can be deposited while the device is in a vacuum chamber. In other embodiments, capping layer 602 is deposited while the device is exposed to an inert gas.

In some embodiments, enclosed spaces, such as enclosed space 604, are vacuum pockets. Vacuum pockets that exist as enclosed spaces, such as enclosed space 604, act to protect the surface of portions of first and/or second insulating magnetic coupler layers 106, 502 and/or thin-film topological insulator layer 104 within the enclosed spaces (e.g., within enclosed space 604). In general, the vacuum pockets are substantially free of gases or other materials. Ideally, a vacuum pocket will be an enclosed space, such as enclosed space 604, which exists in a vacuum. In other embodiments, enclosed spaces, such as enclosed space 604, are filled with an inert gas, such as a noble gas (e.g., helium, neon, argon, krypton, xenon, or radon), or a compound gas, such as a compound gas containing argon. An inert gas can provide structural and/or chemical stability to the portions of thin-film topological insulator layer 104 within the enclosed spaces (e.g., within enclosed space 604). In general, enclosed spaces, such as enclosed space 604 protect the active material (e.g., layers 502, 104, 106) of the magnetic sensing devices of array 1200 from external environmental impurities and effects.

Figure 13:
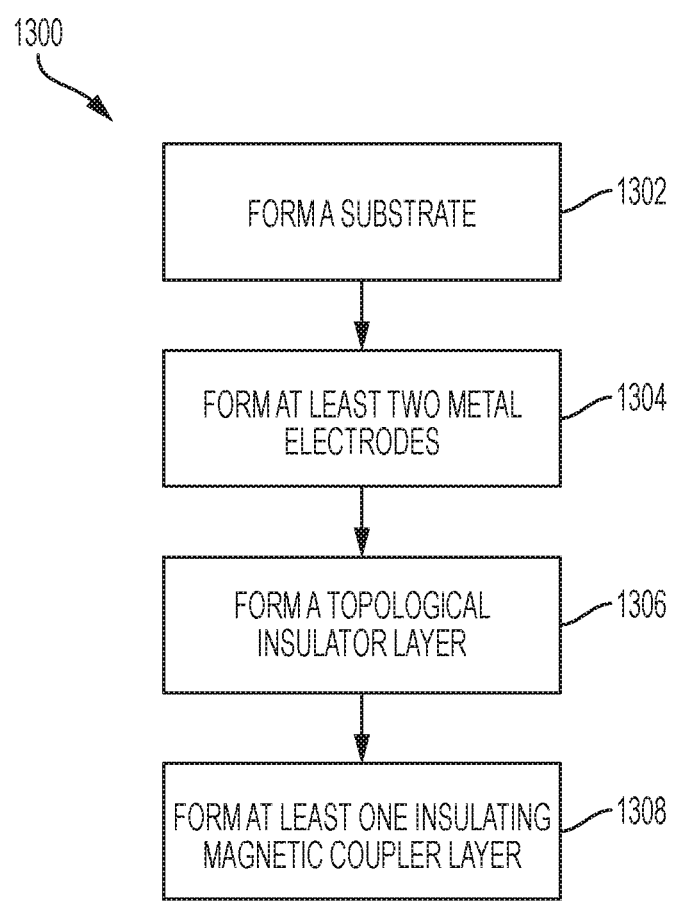
FIG. 13 depicts a flow diagram illustrating a methodology according to one or more embodiments.

FIG. 13 depicts a flow diagram illustrating a methodology 1300 for forming a magnetic sensor according to one or more embodiments of the present disclosure. Methodology 1300 begins a block 1302 by forming a substrate. Block 1304 forms at least two metal electrodes, and block 1306 forms a topological insulator. Block 1308 forms at least one insulating magnetic coupler layer. In accordance with one or more embodiments, the insulating magnetic coupler is sufficiently close to the topological insulator to amplify an applied magnetic field based at least in part on a magnetic exchange effect between the insulating magnetic coupler and the topological insulator. Accordingly, a magnetic sensor according to methodology 1300 can respond to relatively small applied magnetic field magnitudes (e.g., 0.10 Tesla) because the insulating magnetic coupler amplifies the applied magnetic field magnitude to a level that is sufficient to break time reversal symmetry of the topological insulator sensing mechanism, thereby causing a measureable change in the thin film topological insulator's conductance/resistance. The insulating magnetic coupler may contact the topological insulator, or it may be positioned sufficiently close to the topological insulator to effect a magnetic exchange between the insulating magnetic coupler and the topological insulator. The insulating magnetic coupler may be above, below or both above and below the topological insulator.

Methodology 1300 may optionally include doping the topological insulator with doped/implanted magnetic atoms/particles. In addition to the amplification provided by the insulating magnetic coupler, the applied magnetic field magnitude is even further amplified by the magnetic particles. The implanted magnetic particles may be applied to the bulk/interior, the surface state or both the bulk and the surface state areas of the topological insulator.

Methodology 1300 may be repeated to form an array of the disclosed magnetic sensor semiconductor devices at a nanoscale level on the substrate and on ribbed metallic electrode structures and capped with another insulating magnetic coupler layer or a conformal cap (e.g., silicon-nitride) to vacuum protect the magnetic sensor surfaces in a manner that is compatible with standard CMOS integration. Each magnetic sensor (i.e., pixel) of the array can be individually addressed for detection readout. Additionally, conformal growth of topological insulator materials on both the ribbed metal structure and the substrate can provide an extra vertical topological insulator section of the device, which may be utilized to detect magnetic fields in additional dimensions. For example, such a magnetic sensor configuration can simultaneously detecting fields pointing out-of-plane (i.e., perpendicular to the substrate) and in-plane (i.e., parallel to the substrate, or perpendicular to the ribbed side of the substrate).

Thus it can be seen from the foregoing detailed description that the present disclosure provides a number of technical benefits. A magnetic sensor according to the present disclosure operates with increased sensitivity over a broader range of applied magnetic field strengths (e.g., from about 0.10 Tesla to about 20 Tesla), which also allows for operation over a broader range of temperatures (e.g., from absolute zero to 250 degrees Celsius). There are no intrinsic size requirements for the disclosed magnetic sensor. The disclosed magnetic sensor is intrinsically scalable because it becomes more sensitive as it becomes smaller, and because it does not have a net magnetic moment and therefore there are no offset fields to cancel. The disclosed magnetic sensor device possesses low-power requirements because only a small bias current is needed to readout the device.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

It will be understood that those skilled in the art, both now and in the future, may make various improvements and enhancements which fall within the scope of the claims which follow.

What is claimed is:

1. A method of forming a sensor, the method comprising:
forming a first electrode region;
forming a second electrode region;
forming a detector region;
electrically coupling the detector region to the first electrode and the second electrode;
forming the detector region to include a first layer comprising a topological insulator;
the topological insulator having an insulating region in a body of the topological insulator;
the topological insulator further having a conducing path along a surface of the topological insulator, wherein a steady state condition of the topological insulator comprises the insulation region acting as an insulator and the conducting path along the surface of the topological insulator acting as a current conductor;
forming the detector region to further include a second layer comprising a first insulating magnetic coupler configured to amplify the magnetic field applied to the detector region;
wherein a magnetic field applied to the detector region is sufficient to change the steady state condition of the topological insulator by developing energy gaps in the conducting path along the surface of the topological insulator that are sufficient to change a resistance of the conducting path; and
forming the detector region to further comprise a third layer comprising a second insulating magnetic coupler;
wherein the second insulating magnetic coupler amplifies the magnetic field applied to the detector region.

2. The method of claim 1, wherein:
the topological insulator comprises implanted magnetic particles; and
the implanted magnetic particles amplify the magnetic field applied to the detector region.

3. The method of claim 1 further comprising forming a vacuum enclosure over at least a surface of the detector region.

4. The method of claim 1 further comprising:
forming a substrate;
wherein the surface of the topological insulator is formed by:
forming a horizontal region that is substantially parallel to a surface of the substrate; and
forming a vertical region that is substantially perpendicular to the surface of the substrate:
wherein the magnetic field applied to the detector region comprises a magnetic field perpendicular the horizontal region or a magnetic field perpendicular the vertical region.

5. The method of claim 1, wherein the detector region comprises a third layer comprising a second insulating magnetic coupler.

6. The method of claim 5, wherein the second insulating magnetic coupler amplifies the magnetic field applied to the detector region.

7. The method of claim 6, wherein the second insulating coupler amplifies the magnetic field based at least in part on a magnetic exchange effect between the first layer and the third layer.

8. A method of forming a sensor, the method comprising:
forming a first electrode region;

forming a second electrode region;
forming a detector region; and
electrically coupling the detector region to the first electrode region and the second electrode region;
the detector region comprising a first layer comprising a topological insulator;
the topological insulator having an insulating region in a body of the topological insulator;
the topological insulator further having a conducing path along a surface of the topological insulator, wherein a steady state condition of the topological insulator comprises the insulation region acting as an insulator and the conducting path along the surface of the topological insulator acting as a current conductor;
the detector region further comprising a second layer comprising a first insulating magnetic coupler;
wherein a magnetic field applied to the detector region is sufficient to change a resistance of the conducting path by:
  developing energy gaps in the conducting path along the surface of the topological insulator that are sufficient to change a resistance of the conducting path along the surface of the topological insulator; and
  breaking a time-reversal symmetry characteristic of the topological insulator; and
wherein the first insulating magnetic coupler amplifies the magnetic field applied to the detector region based at least in part on a magnetic exchange effect between the first layer and the second layer.

9. The method of claim 8, wherein:
the detector region comprises a third layer comprising a second insulating magnetic coupler.

10. The method of claim 8, wherein the second insulating magnetic coupler amplifies the magnetic field applied to the detector region.

11. The method of claim 10, wherein the second insulating coupler amplifies the magnetic field based at least in part on a magnetic exchange effect between the first layer and the third layer.

12. A method of forming a sensor, the method comprising:
forming a first electrode region;
forming a second electrode region; and
forming a detector region electrically coupled between the first electrode region and the second electrode region;
forming the detector region such that it comprises a first layer comprising a topological insulator;
the topological insulator having an insulating region in a body of the topological insulator;
the topological insulator further having a conducing path along a surface of the topological insulator, wherein a steady state condition of the topological insulator comprises the insulation region acting as an insulator and the conducting path along the surface of the topological insulator acting as a current conductor; and
forming the detector region such that it further comprises a second layer comprising a first insulating magnetic coupler;
wherein the first insulating magnetic coupler is positioned on or sufficiently close to the topological insulator such that the first insulating magnetic coupler amplifies a magnetic field applied to the detector region to a level that is sufficient to break a time reversal symmetry characteristic of the topological insulator; and
wherein the magnetic field, which has been amplified by the first insulating magnetic coupler and applied to the detector region, is sufficient to change the steady state condition of the topological insulator by developing energy gaps in the conducting path along the surface of the topological insulator that are sufficient to change a resistance of the conducting path.

13. The method of claim 12, wherein the change to the resistance is sufficient to change the conducting path to an insulator.

* * * * *